(12) United States Patent
Heuts et al.

(10) Patent No.: US 6,614,290 B2
(45) Date of Patent: Sep. 2, 2003

(54) INTEGRATED CIRCUIT

(75) Inventors: Patrick Willem Hubert Heuts, Nijmegen (NL); Jozef Laurentius Wilhelmus Kessels, Eindhoven (NL); Adrianus Marinus Gerardus Peeters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/067,044

(22) Filed: Feb. 4, 2002

(65) Prior Publication Data

US 2002/0120894 A1 Aug. 29, 2002

(30) Foreign Application Priority Data

Feb. 7, 2001 (EP) .............................................. 01200433

(51) Int. Cl.[7] ................................................. G06F 11/00

(52) U.S. Cl. ....................................... 327/403; 371/10.2

(58) Field of Search ................................ 327/565, 403; 371/317, 22.3, 10.2

(56) References Cited

U.S. PATENT DOCUMENTS

| 5,309,444 A | * | 5/1994 | Dartois et al. ............. 371/10.2 |
| 5,675,589 A | * | 10/1997 | Yee ............................. 364/488 |
| 5,960,008 A | | 9/1999 | Osawa et al. ............ 371/22.31 |

FOREIGN PATENT DOCUMENTS

| WO | WO9956396 | 11/1999 | ....... G01R/31/3167 |

* cited by examiner

*Primary Examiner*—Dinh T. Le
(74) *Attorney, Agent, or Firm*—Aaron Waxler

(57) ABSTRACT

An integrated circuit according to the invention comprises at least a first and a second circuit (1, 2 resp.) and a first and a second signal path (10–20 and 11–21 resp.) between the first and the second circuit. The first and the second signal path each comprise a selection element (30) which has a first input (30a, 31a) coupled to the first circuit (1), and a second input (30b, 31b). The selection element (30) has an output (30c, 31c) coupled to the second circuit (2). The second input (31b) of the selection element (31) of the second signal path (11–21) is coupled to a memory element (41). The output (40a) of the selection element (30) of the first signal path (10–20) is coupled to an input (40a) of the memory element (40).

8 Claims, 2 Drawing Sheets

INTEGRATED CIRCUIT

FIELD OF THE INVENTION

The invention pertains to an integrated circuit comprising at least a first and a second circuit and a first and a second signal path between the first and the second circuit, the first and the second signal path each comprising a selection element having a first input coupled to the first circuit, a second input, and an output coupled to the second circuit, the second input of the selection element of the second signal path being coupled to a memory element.

BACKGROUND OF THE INVENTION

For reasons of design and test efficiency, IC-design usually runs along the lines of identifying a number of more or less independent sub-functions and implementing these sub-functions as separate circuits or functional blocks, also called cores or macros. In a later design stage, the various (analog and/or digital) macros are interconnected through a number of signal paths, thereby eventually enabling the IC to perform its intended functionality. Production testing of such an IC is preferably carried out according to the macro test concept, i.e. all macros are tested individually, rather than that the IC is tested as a whole. For further information on macro testing reference is made to U.S. Pat. No. 5,477,548.

WO 99/56396 describes a seam circuit for coupling such a first and a second circuit within an IC, the seam circuit comprising a selection element and a memory element. The selection element and the memory element form a feedback loop, in that the memory element is coupled between an output and a first input of the selection element. In order to enable scanning of the memory elements, the latter are formed by flip-flops having apart from a data input a scan data input, which is either coupled to an input of the scan chain, or to a preceding element of the scan chain. The flip flops comprise a selection input to select between the data input and the scan data input. During normal operation of the IC, the selection element is set into a first state in which it selects the signal offered at its first input. In that state the selection element, e.g. a multiplexer functionally couples the second circuit to the first circuit with only the delay of the selection element. At the same time the output signal of the selection element may be read into the memory element, so as to observe the output of the first circuit. In the second state the selection element selects the signal offered at its second input, which is provided by the memory element. This provides for the possibility of controlling the input of the second input. The memory elements formed by the flip-flops form part of a scan chain. For that purpose each flip-flop within the chain has a scandata input coupled to an output of a preceding flip-flop in the chain and an output coupled to a scandata input of the succeeding flip-flop in the chain. The scandata input of the first flip-flop of the chain forms the input of the scan chain, and the output of the last flip-flop in the chain forms the output of the scan chain. It is a drawback of the known IC that relative complex test circuitry is described therein. In order to enable the memory element to select either a first input (data) or a second input (test data), it requires an additional selection element.

SUMMARY OF THE INVENTION

It is a purpose of the invention to provide an IC which also enables production testing, but which has simpler test circuitry. The IC according to the invention, therefore is characterized in that the selection element of the second signal path has an output coupled to an input of the memory element. The test circuitry of the IC of the invention is simpler than that of the known IC, in that only one selection element is required for each signal path which has to be controlled or observed. It is however possible to apply the same test functions as is possible with the known IC. The IC according to the invention likewise has a normal operating state and a test state. In the normal operating state the selection elements are in a first state in which they functionally couple the second circuit to the first circuit via the respective signal paths. In the scan state the selection elements connect the memory elements to each other so as to form the scan chain. During normal operation the output signal of the selection elements may be read into memory elements, so as to observe the operation of the first circuit. And during the scan state the inputs of the second circuits may be controlled.

The embodiment of claim 2 has the advantage that each of the inputs of the second circuit may be controlled simultaneously. Alternatively each of the outputs of the first circuit may be controlled simultaneously. Since a latch requires less components than a flip-flop, the embodiment of claim 3 has the advantage that a still further simplification of the test circuitry is achieved. Still each of the signal paths may be observed or controlled, albeit that a first half should be tested in a first test cycle, and the second half in a second test cycle.

BRIEF DESCRIPTION OF THE DRAWINGS

These and other aspects of the invention are described in more detail, with reference to the drawing. Therein.

DETAILED DESCRIPTION OF THE INVENTION

Figure 1:
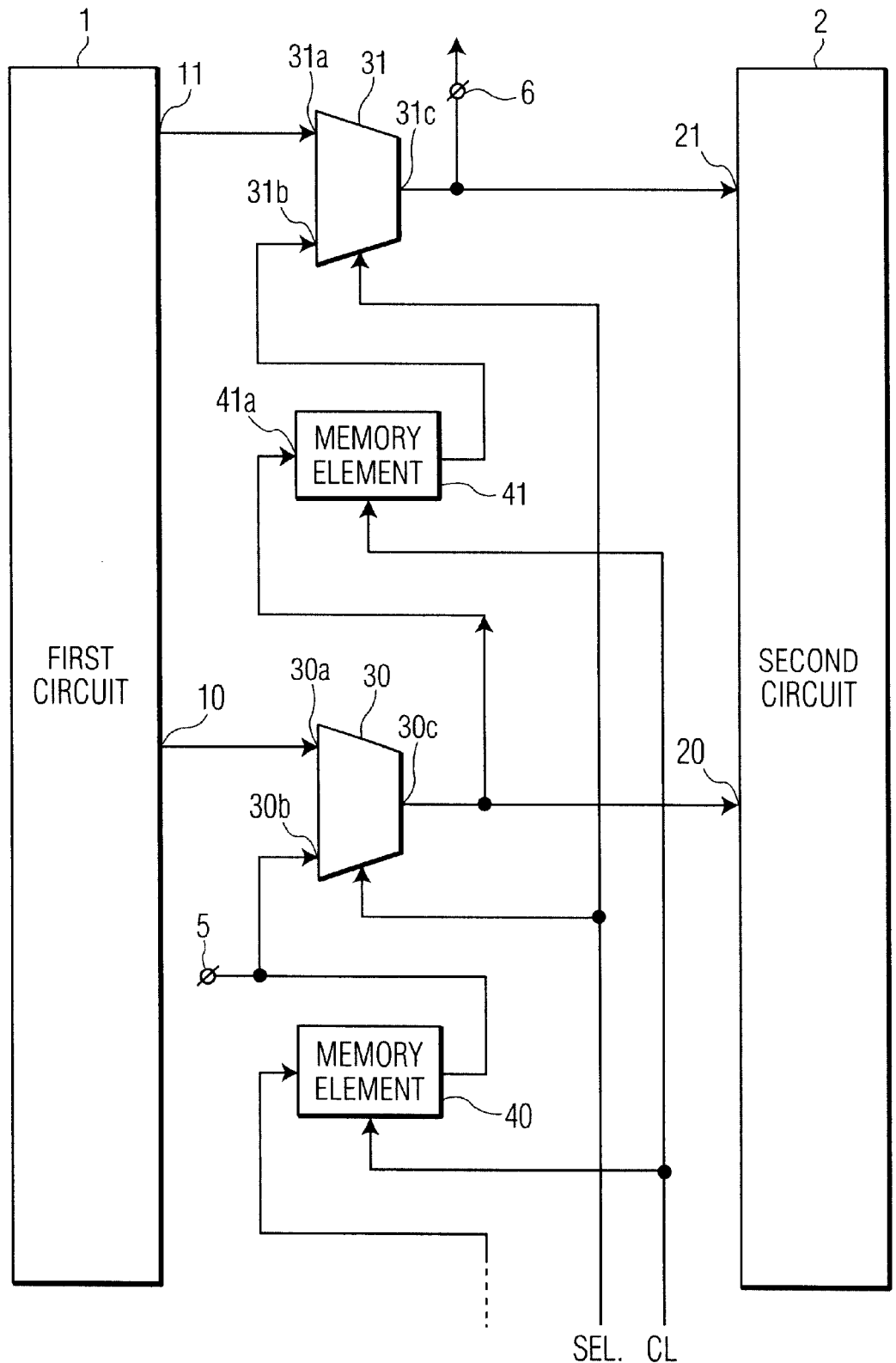
FIG. 1 shows a first embodiment of the integrated circuit according to the invention.

FIG. 1 shows a first embodiment of the integrated circuit according to the invention. The integrated circuit comprises at least a first and a second circuit 1, 2. Each of the first 1 and the second circuit 2 may be operated synchronously or asynchronously and may process either digital or analog data. When both circuits operate synchronously, they may have different clock rates. The first and the second circuit 1,2 are coupled via a first signal path 10–20 and a second signal path 11–21 between the first and the second circuit 1,2. The first signal path extends from an output 10 of the first circuit 1, to an input 20 of the second circuit. The second signal path extends from an output 11 of the first circuit 1, to an input 21 of the second circuit. The first signal path comprises a selection element 30 having a first input 30a coupled to the first circuit 1, a second input 30b and an output 30c coupled to the second circuit 2. Likewise, the second signal path comprises a selection element 31 having a first input 31a coupled to the first circuit 1, a second input 31b and an output 31c coupled to the second circuit 2. The selection element 30 of the first signal path 10, 20 has an output 30c coupled to an input 40a of a memory element 41.

The second input 31b of the selection element 31 of the second signal path 11–21 is coupled to the memory element 41.

The second input 30b of the selection element 30 may be connected to a test input 5, but may otherwise be coupled to a further memory element forming part of a scan chain, which on its turn has an input coupled to an output of a selection element of a further signal path. The output 31c of the selection element 31 may form the output 6 of the scan chain, but may otherwise be connected to an input of a succeeding memory element in the scan chain.

The selection elements 30, 31 are controlled by a selection signal Sel. During normal operation of the IC, the selection elements are set into a first state in which the selection elements 30, 31 select the signal at their first inputs 30a, 31a received from the outputs 10, 11 of the first circuit. The output signals of these outputs may be observed by first writing the output signals of the selection elements, into the memory elements, here, by providing a clock signal C1 to said memory elements . . . , 40, 41, . . . After this first step, the selection elements . . . , 30, 31, . . . are set into a second state in which the selection elements select the signal at their second inputs . . . , 30b, 31b, . . . as their input signal. In this second state the contents of the memory elements may be sequentially observed at an output 6 by providing a sequence of clock cycles to the memory elements. In the second state of the selection elements it is also possible to sequentially load the memory elements 40, 41, . . . from an input 5 with test values for the second circuit 2, and operate the second circuit 2 after loading has completed.

Figure 2:
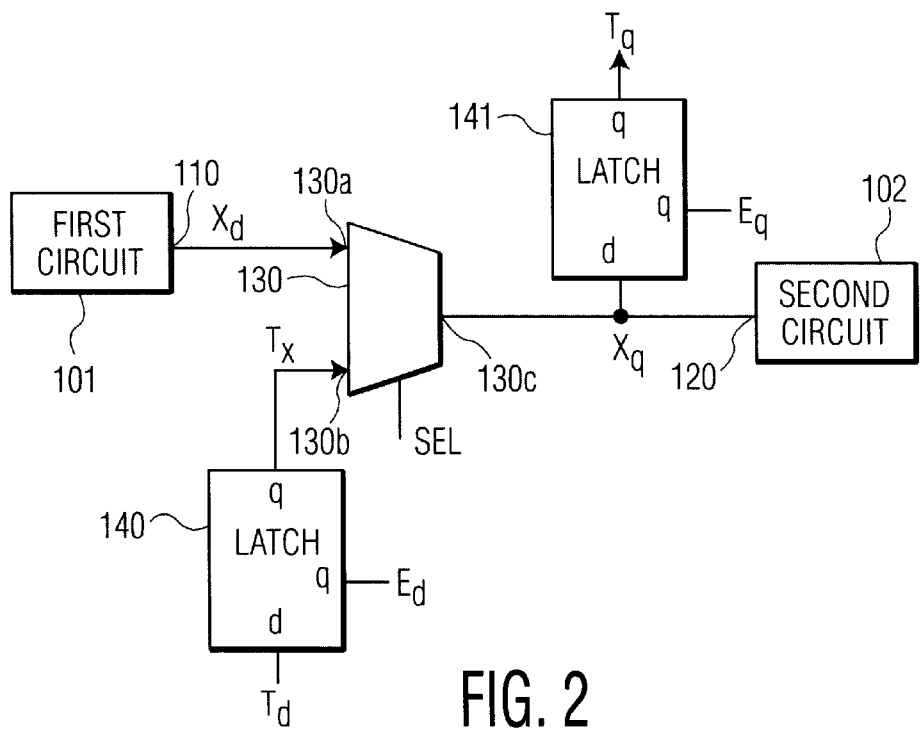
FIG. 2 shows a portion of a second embodiment of the integrated circuit according to the invention.

FIG. 2 shows a portion of a second embodiment of the invention. Elements therein corresponding to those of FIG. 1 have a reference numeral which is 100 higher. This embodiment differs from the embodiment of FIG. 1, in that the memory elements 140, 141 are in the form of latches instead of flip-flops. The latches forming the scan chain are controlled by a first and a second control signal Ed, Eq. In order to load data in the scan chain . . . 140, 141, . . . or to read data from the scan chain alternately set the first control signal Ed has a logical value "1" and the second control signal Eq a value "0" and the other way around.

Figure 3:
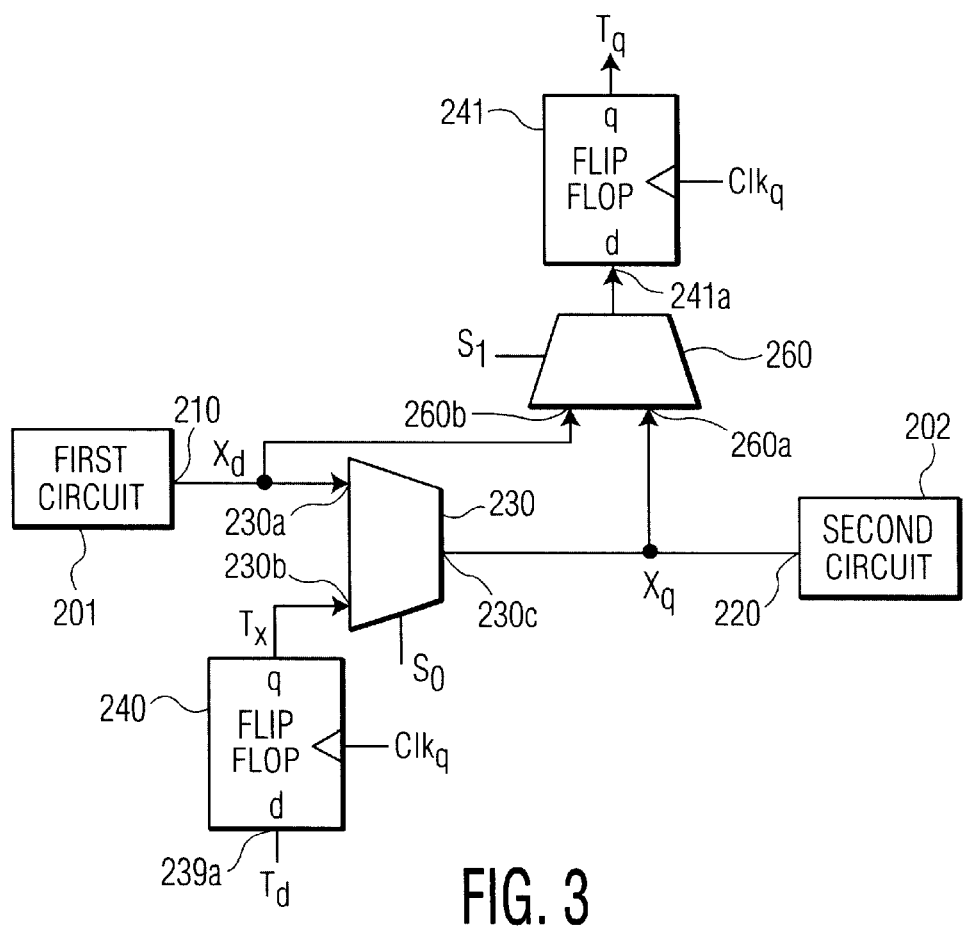
FIG. 3 shows a portion of a third embodiment of the integrated circuit according to the invention.

The present invention allows for a simpler test circuitry. By adding further components to this circuitry it is however possible to increase the functionality of the circuit. This is illustrated by FIG. 3 showing another preferred embodiment. In FIG. 3 parts corresponding to those of FIG. 2 have a reference numeral which is 100 higher. The embodiment shown therein is characterized by a further selection element 260. The further selection element 260 has a first input 260a coupled to the output 230c of the selection element 230 so as to couple this output 230c via said further selection element 260 to the memory element 241. The further selection element 260 further has a second input 260b coupled to the first input 230a of the selection element 230. The selection element 230 and the further selection element 260 respectively are controlled by a control signal $S_0$, and a control signal $S_1$.

Given the two multiplex control signals, there are four modes of operation.

S0 selects the output signal Xd from the first circuit 201 and S1 selects Xd as well. In this mode, observability of Xd is established directly.

S0 selects Xd and S1 selects Xq at the output 230c of the selection element 230. In this mode, observability of Xd is established through Xq. This tests the functional path through the test circuit.

S0 selects Tx at the output of the memory element 240 and S1 selects Xq. This mode can be used (i) during scan (during which it enables a path from Td to Tq) and (ii) for controllability of Xq.

S0 selects Tx and S1 selects Xd. In this mode the circuit provides both observability and controllability at the same time. It is useful especially if in certain test modes block A and B have to be tested simultaneously (potentially operating at the same clock and using the same scan chains).

An integrated circuit according to the invention is suitable for many purposes. In a particular embodiment of the integrated circuit according to the invention one of the circuits comprises a LIN or CAN transceiver.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. Integrated circuit comprising:
   at least a first and a second circuit; and
   a first and a second signal path between the first and the second circuits, the first and the second signal paths each comprising:
      a selection element having a first input coupled to the first circuit, a second input, and
   an output coupled to the second circuit,
   the second input of the selection element of the second signal path being coupled to a memory element,
   wherein the output of the selection element of the first signal path is coupled to an input of the memory element.

2. Integrated circuit according to claim 1, the first and the second signal paths each further comprising:
   a further selection element having a first input coupled to the output of the selection element so as to couple the output of the selection element via the further selection element to the memory element, the further selection element further having a second input coupled to the first input of the selection element.

3. Integrated circuit according to claim 1, wherein the memory element is a flip-flop.

4. Integrated circuit according to claim 1, wherein the memory element is a latch.

5. Integrated circuit according to claim 1, wherein one of the circuits is an analog circuit and the other of the circuits is a digital circuit.

6. Integrated circuit according to claim 1, wherein one of the circuits operates synchronously and the other of the circuits operates asynchronously.

7. Integrated circuit according to claim 1, wherein both circuits operate synchronously at different clock rates.

8. Integrated circuit according to claim 1, wherein one of the circuits comprises a Local Interconnect Network (LUST) or Controller Area Network (CAN) transceiver.

* * * * *